United States Patent
Post et al.

(10) Patent No.: US 8,832,507 B2
(45) Date of Patent: Sep. 9, 2014

(54) SYSTEMS AND METHODS FOR GENERATING DYNAMIC SUPER BLOCKS

(75) Inventors: Daniel J. Post, Campbell, CA (US); Hsiao Thio, San Jose, CA (US)

(73) Assignee: Apple Inc., Cupertino, CA (US)

( * ) Notice: Subject to any disclaimer, the term of this patent is extended or adjusted under 35 U.S.C. 154(b) by 397 days.

(21) Appl. No.: 12/861,718

(22) Filed: Aug. 23, 2010

(65) Prior Publication Data

US 2012/0047409 A1 Feb. 23, 2012

(51) Int. Cl.
| | | |
|---|---|---|
| G11C 29/00 | (2006.01) |
| G06F 12/02 | (2006.01) |
| G06F 11/10 | (2006.01) |
| H03M 13/09 | (2006.01) |
| G11C 29/04 | (2006.01) |
| H03M 13/15 | (2006.01) |

(52) U.S. Cl.
CPC ........... *G06F 11/1048* (2013.01); *H03M 13/09* (2013.01); *G11C 2029/0411* (2013.01); *G06F 12/0246* (2013.01); *G06F 2212/7208* (2013.01); *H03M 13/1515* (2013.01); *G11C 29/82* (2013.01); *H03M 13/152* (2013.01); *G11C 29/883* (2013.01)
USPC .......................................................... 714/718

(58) Field of Classification Search
CPC .................................................. G06F 11/1072
USPC ........................................................ 714/718
See application file for complete search history.

(56) References Cited

U.S. PATENT DOCUMENTS

| | | | |
|---|---|---|---|
| 5,586,285 A | | 12/1996 | Hasbun et al. |
| 5,928,370 A | * | 7/1999 | Asnaashari ..................... 714/48 |
| 6,725,321 B1 | * | 4/2004 | Sinclair et al. ................ 711/103 |
| 6,895,464 B2 | | 5/2005 | Chow et al. |
| 8,402,243 B2 | | 3/2013 | Wakrat et al. |
| 2005/0235124 A1 | | 10/2005 | Pomaranski et al. |
| 2009/0240873 A1 | * | 9/2009 | Yu et al. ......................... 711/103 |
| 2009/0259799 A1 | | 10/2009 | Wong |
| 2009/0323418 A1 | * | 12/2009 | Cornwell et al. ........ 365/185.09 |
| 2010/0153680 A1 | | 6/2010 | Baum et al. |
| 2010/0235715 A1 | * | 9/2010 | Thatcher et al. .............. 714/763 |
| 2011/0066793 A1 | * | 3/2011 | Burd .............................. 711/103 |
| 2011/0302477 A1 | * | 12/2011 | Goss et al. ..................... 714/773 |
| 2012/0240012 A1 | * | 9/2012 | Weathers et al. ............. 714/773 |

* cited by examiner

*Primary Examiner* — Michael Maskulinski
(74) *Attorney, Agent, or Firm* — Van Court & Aldridge LLP

(57) ABSTRACT

Systems and methods are disclosed for generating dynamic super blocks from one or more grown bad blocks of a non-volatile memory ("NVM"). In some embodiments, a dynamic super block can be formed by striping together a subset of memory locations of grown bad blocks from one or more dies of a NVM. The subset of memory locations may be selected based on at least one reliability measurement of the subset of memory locations. In some embodiments, in response to detecting one or more access failures in a portion of the dynamic super block, the NVM interface can retire at least a portion of the dynamic super block. In some embodiments, the NVM interface can reconstruct a new dynamic super block from the dynamic super block by progressively increasing the size of the new dynamic super block.

25 Claims, 8 Drawing Sheets

SYSTEMS AND METHODS FOR GENERATING DYNAMIC SUPER BLOCKS

FIELD OF THE INVENTION

This can relate to systems and methods for generating dynamic super blocks from one or more bad blocks of a non-volatile memory.

BACKGROUND OF THE DISCLOSURE

NAND flash memory, as well as other types of non-volatile memories ("NVMs"), are commonly used for mass storage. For example, consumer electronics such as portable media players often include flash memory to store music, videos, and other media.

NVMs, however, may develop defective memory cells through everyday use, and operational memory cells may suffer from program/erase/read disturb due to voltages applied to neighboring cells. A block of a NVM that have one or more of these non-operational memory cells may be referred to as a "bad block".

Conventionally, when a system determines that a block of a NVM is a bad block, the system may retire the entire block. Unfortunately, such a scheme reduces the pool of remaining programmable blocks in the NVM and also leads to increased cycling of the remaining blocks. Both of these factors can shorten the lifespan of the NVM.

SUMMARY OF THE DISCLOSURE

Systems and methods are disclosed for generating dynamic super blocks from one or more bad blocks of a non-volatile memory ("NVM"). In particular, a system can generate a new dynamic super block from a subset of memory locations of one or more bad blocks of the NVM. In this way, portions of blocks that would otherwise be completely retired can be recycled to form a dynamic super block. Such a system can reduce the rate at which the pool of programmable blocks is shrinking, thereby increasing the lifespan of the NVM and reducing the cycling of blocks of the NVM.

Bad blocks used in various embodiments of the invention may include only "grown bad blocks". Grown bad blocks may be those bad blocks that develop over time from previously good blocks as a NVM degrades due to the effects of a large number of cycles.

A dynamic super block can be formed by striping together a subset of memory locations of grown bad blocks from one or more dies of a NVM. The subset of memory locations may be selected based on at least one reliability measurement of the subset of memory locations. The subset of memory locations can include, for example, a subset of word lines, a subset of pages, any other suitable memory locations of a block, and/or any combination thereof.

In some embodiments, the reliability measurement can be calculated based on one or more tests performed on the subset of memory locations. For example, a memory interface of the system may determine that a block is a grown bad block by detecting at least one access failure in a first subset of word lines of the block. Responsive to this detection, the memory interface can perform one or more tests on a second subset of word lines. If the memory interface determines that the second subset of word lines passes the one or more tests, the memory interface can select the second subset of word lines as the subset of memory locations.

In other embodiments, the memory interface can select lower pages, upper pages, or a combination of lower and upper pages of a block as the subset of memory locations. Pages of the block can be selected based on one or more characteristics of the NVM such as, for example, a vendor of the NVM, a known fingerprint of the NVM, the susceptibility to error of pages of the NVM, any other suitable characteristic(s), and/or any combination thereof. In further embodiments, memory locations that have high raw bit error rates ("RBERs") or high uncorrectable bit error rates ("UBERs") can be excluded from the subset of memory locations.

After selecting the subset of memory locations, the subset of memory locations can be striped together to form at least a portion of a dynamic super block. The dynamic super block can then be used in a different mode (e.g., the dynamic super block can be used as a SLC block).

In some embodiments, the memory interface may be selective about the types of data that can be stored in the dynamic super block (e.g., recoverable data or less important data), and/or the types of error detection and/or correction that are applied to the dynamic super block (e.g., higher strength error correction coding engines or higher number of parity pages).

In some embodiments, in response to detecting one or more access failures in a portion of the dynamic super block, the memory interface can retire the portion of the dynamic super block. In some embodiments, in response to detecting that additional spare memory locations are needed, the memory interface can reconstruct a new dynamic super block from the dynamic super block by progressively increasing the size of the new dynamic super block.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

Figure 1:
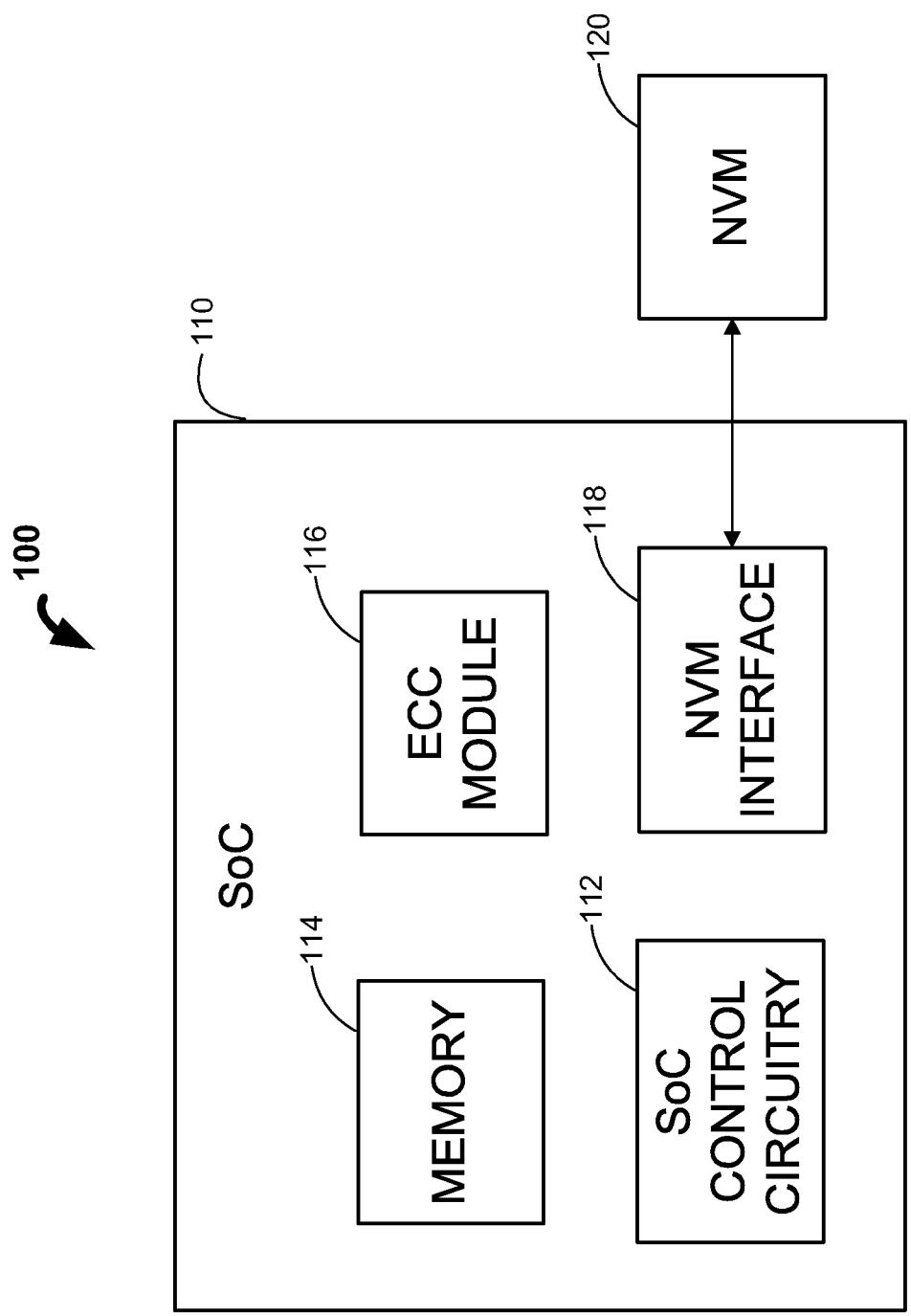
FIGS. 1 and 2 are schematic views of electronic devices configured in accordance with various embodiments of the invention.

FIG. 1 is a schematic view of electronic device 100. In some embodiments, electronic device 100 can be or can include a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, a laptop computer, and any other suitable type of electronic device.

Electronic device 100 can include system-on-a-chip ("SoC") 110 and non-volatile memory ("NVM") 120. Non-volatile memory 120 can include a NAND flash memory based on floating gate or charge trapping technology, NOR flash memory, erasable programmable read only memory ("EPROM"), electrically erasable programmable read only memory ("EEPROM"), Ferroelectric RAM ("FRAM"), magnetoresistive RAM ("MRAM"), any other known or future types of non-volatile memory technology, or any combination thereof.

NVM 120 can be organized into "blocks", which is the smallest erasable unit, and further organized into "pages", which can be the smallest unit that can be programmed or read. In some embodiments, NVM 120 can include multiple integrated circuits (e.g., one or more dies), where each integrated circuit may have multiple blocks. Memory locations (e.g., blocks, pages of blocks, or word lines of blocks) from corresponding integrated circuits may form "super blocks". Each memory location of NVM 120 can be addressed using a physical address (e.g., a physical page address or physical block address).

Physically, a block in NVM 120 can include an array of memory cells aligned in rows corresponding to word lines. The memory cells of a block may be configured as single-level cells ("SLC") or multi-level cells ("MLC"), and each word line in the block may be configured for use in storing one page (in a SLC case) or multiple pages (in a MLC case). Thus, the number of pages in a given block may be based on the number of bits stored per memory cell. Due to the increased density of storage, a block being used as a 2-bit MLC block may include twice the number of pages as when the same block is being used as a SLC block. In some embodiments, for a block composed of 64 word lines, the block may include 64 pages when used as a SLC block, 128 pages when used as a 2-bit MLC block, 192 pages when used as a 3-bit MLC block, and so on. These numbers, however, are merely illustrative and a block of NVM 120 may include any other suitable number of pages.

FIG. 1, as well as later figures and various disclosed embodiments, may sometimes be described in terms of using flash technology. However, this is not intended to be limiting, and any other type of non-volatile memory can be implemented instead. Electronic device 100 can include other components, such as a power supply or any user input or output components, which are not depicted in FIG. 1 to prevent overcomplicating the figure.

System-on-a-chip 110 can include SoC control circuitry 112, memory 114, error correction code ("ECC") module 116, and NVM interface 118. SoC control circuitry 112 can control the general operations and functions of SoC 110 and the other components of SoC 110 or device 100. For example, responsive to user inputs and/or the instructions of an application or operating system, SoC control circuitry 112 can issue read or write commands to NVM interface 118 to obtain data from or store data in NVM 120. For clarity, data that SoC control circuitry 112 may request for storage or retrieval may be referred to as "user data," even though the data may not be directly associated with a user or user application. Rather, the user data can be any suitable sequence of digital information generated or obtained by SoC control circuitry 112 (e.g., via an application or operating system).

SoC control circuitry 112 can include any combination of hardware, software, and firmware, and any components, circuitry, or logic operative to drive the functionality of electronic device 100. For example, SoC control circuitry 112 can include one or more processors that operate under the control of software/firmware stored in NVM 120 or memory 114.

Memory 114 can include any suitable type of volatile or non-volatile memory, such as dynamic random access memory ("DRAM"), synchronous dynamic random access memory ("SDRAM"), double-data-rate ("DDR") RAM, cache memory, read-only memory ("ROM"), or any combination thereof. Memory 114 can include a data source that can temporarily store user data for programming into or reading from non-volatile memory 120. In some embodiments, memory 114 may act as the main memory for any processors implemented as part of SoC control circuitry 112.

ECC module 116 can employ one or more error correcting or error detecting codes, such as a Reed-Solomon ("RS") code, a Bose, Chaudhuri and Hocquenghem ("BCH") code, a cyclic redundancy check ("CRC") code, or any other suitable error correcting or detecting code. Although ECC module 116 is shown in FIG. 1 as included in SoC 110, persons skilled in the art will appreciate that ECC module 116 may instead be implemented in NVM 120.

In some embodiments, ECC module 116 may include multiple ECC engines (not shown in FIG. 1), which may be used to protect data stored in NVM 120. ECC engines can have different "strengths". As used herein, the "strength" of an ECC may indicate the maximum number of errors (e.g., bit flips) that may be corrected by the ECC. ECC engines that have a higher strength can generally correct and detect more errors than ECC engines that have a lower strength. Therefore, the type and strength of the ECC engines may be selected based on the properties and reliability of NVM 120.

In other embodiments, one or more error correcting or detecting codes employed by ECC module 116 can be used to generate ECC data. As used herein, the term "ECC data" can refer to any suitable data (e.g., metadata) that can be generated by applying an error correcting or detecting code to user data, where the ECC data can be used for verifying the user data, correcting the user data, or both.

One type of ECC data that can be generated by ECC module 116 is "inner ECC data". Inner ECC data can be generated by applying an error correcting code to the user data of a single page of NVM 120. Inner ECC data can be used to correct and/or verify the user data of that page.

Another type of ECC data that can be generated by ECC module 116 is "outer ECC data". Outer ECC data can be generated by applying an error correcting code to the user data of an entire codeword. As used herein, a "codeword" can refer to data included in one or more contiguous pages of NVM 120 that together form a piece of information. Consequently, the outer ECC data can be used to correct and/or verify the user data of the entire codeword. In some embodiments, the outer ECC data can be stored in one or more pages of NVM 120, which can sometimes be referred to as one or more "parity pages".

Generally, ECC module 116 can provide greater protection for user data by increasing the number of parity pages that are associated with the user data. That is, by running multiple error correcting codes on the user data and generating additional sets of outer ECC data, ECC module 116 can detect and/or correct additional errors in the user data.

NVM interface 118 may include any suitable combination of hardware, software, and/or firmware configured to act as an interface or driver between SoC control circuitry 112 and NVM 120. For any software modules included in NVM interface 118, corresponding program code may be stored in NVM 120 or memory 114.

NVM interface 118 can perform a variety of functions that allow SoC control circuitry 112 to access NVM 120 and to manage the memory locations (e.g., pages, blocks, super blocks, integrated circuits) of NVM 120 and the data stored therein (e.g., user data). For example, NVM interface 118 can interpret the read or write commands from SoC control circuitry 112, perform wear leveling, and generate read and program instructions compatible with the bus protocol of NVM 120.

While SoC control circuitry 112 and NVM interface 118 are shown as separate modules, this is intended only to simplify the description of the embodiments of the invention. It should be understood that these modules may share hardware components, software components, or both. For example, a processor implemented as part of SoC control circuitry 112 may execute a software-based memory driver for NVM interface 118. Accordingly, portions of SoC control circuitry 112 and NVM interface 118 may sometimes be referred to collectively as "control circuitry."

FIG. 1 illustrates an electronic device where NVM 120 may not have its own controller. In other embodiments, electronic device 100 can include a target device, such as a flash or SD card, that includes NVM 120 and some or all portions of NVM interface 118 (e.g., a translation layer, discussed below). In these embodiments, SoC 110 or SoC control circuitry 112 may act as the host controller for the target device. For example, as the host controller, SoC 110 can issue read and write requests to the target device.

Figure 2:
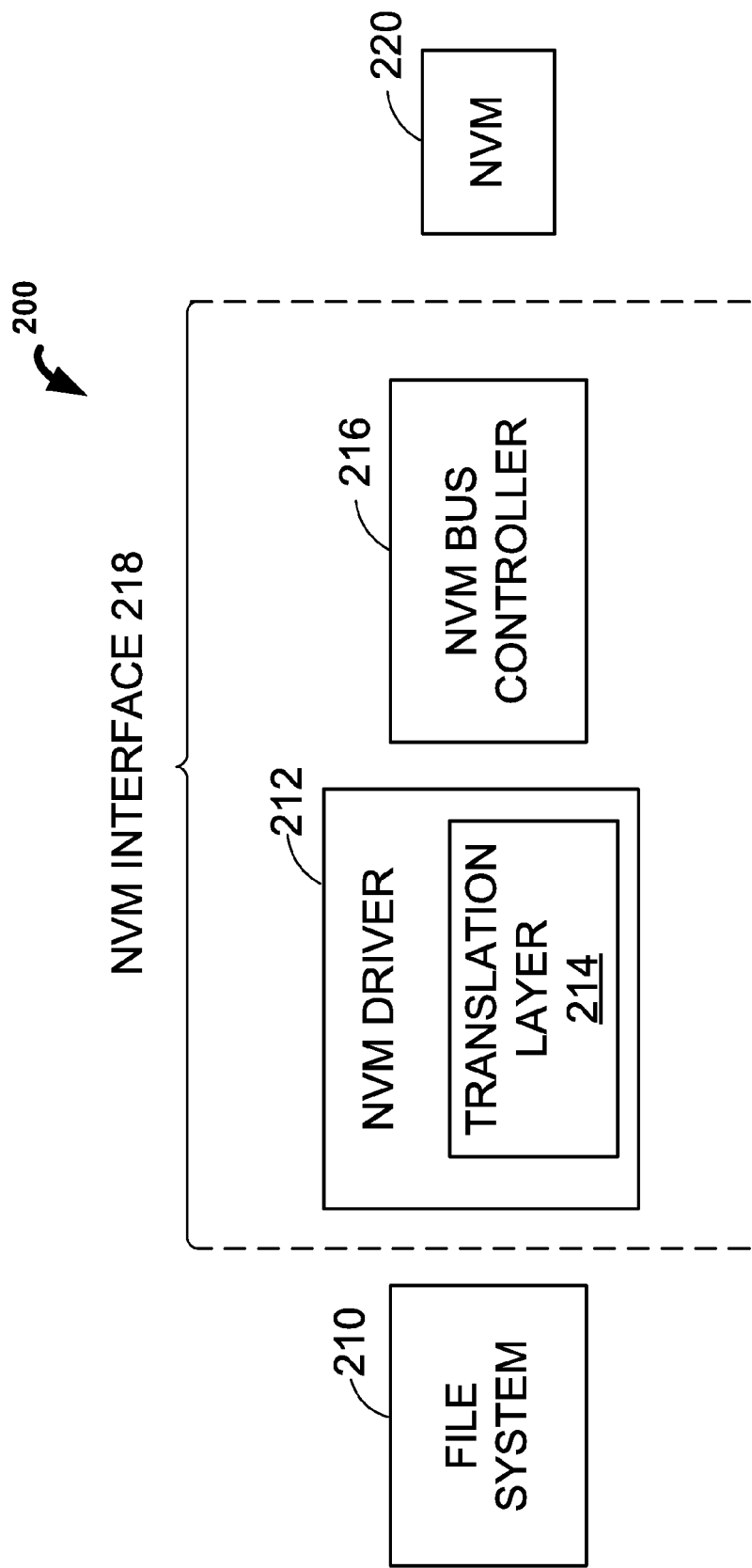

FIG. 2 is a schematic view of electronic device 200, which may illustrate in greater detail some of the firmware, software and/or hardware components of electronic device 100 (FIG. 1) in accordance with various embodiments. Electronic device 200 may have any of the features and functionalities described above in connection with FIG. 1, and vice versa. Electronic device 200 can include file system 210, NVM driver 212, NVM bus controller 216, and NVM 220. In some embodiments, file system 210 and NVM driver 212 may be software or firmware modules, and NVM bus controller 216 and NVM 220 may be hardware modules. Accordingly, in these embodiments, NVM driver 212 may represent the software or firmware aspect of NVM interface 218, and NVM bus controller 216 may represent the hardware aspect of NVM interface 218.

File system 210 can include any suitable type of file system, such as a File Allocation Table ("FAT") file system, and may be part of the operating system of electronic device 200 (e.g., part of SoC control circuitry 112 of FIG. 1). In some embodiments, file system 210 may include a flash file system, which provides a logical to physical mapping of pages. In these embodiments, file system 210 may perform some or all of the functionalities of NVM driver 212 discussed below, and therefore file system 210 and NVM driver 212 may or may not be separate modules.

File system 210 may manage file and folder structures for the application and operating system. File system 210 may operate under the control of an application or operating system running on electronic device 200, and may provide write and read commands to NVM driver 212 when the application or operating system requests that information be read from or stored in NVM 220. Along with each read or write command, file system 210 can provide a logical address to indicate where the user data should be read from or written to, such as a logical page address or a logical block address with a page offset.

File system 210 may provide read and write requests to NVM driver 212 that are not directly compatible with NVM 220. For example, the logical addresses may use conventions or protocols typical of hard-drive-based systems. A hard-drive-based system, unlike flash memory, can overwrite a memory location without first performing a block erase. Moreover, hard drives may not need wear leveling to increase the lifespan of the device. Therefore, NVM interface 218 can perform any functions that are memory-specific, vendor-specific, or both to handle file system requests and perform other management functions in a manner suitable for NVM 220.

NVM driver 212 can include translation layer 214. In some embodiments, translation layer 214 may be or include a flash translation layer ("FTL"). On a write operation, translation layer 214 can map the provided logical address to a free, erased physical location on NVM 220. On a read operation, translation layer 214 can use the provided logical address to determine the physical address at which the requested data is stored. Because each NVM may have a different layout depending on the size or vendor of the NVM, this mapping operation may be memory and/or vendor-specific. Translation layer 214 can perform any other suitable functions in addition to logical-to-physical address mapping. For example, translation layer 214 can perform any of the other functions that may be typical of flash translation layers, such as garbage collection and wear leveling.

NVM driver 212 may interface with NVM bus controller 216 to complete NVM access requests (e.g., program, read, and erase requests). Bus controller 216 may act as the hardware interface to NVM 220, and can communicate with NVM 220 using the bus protocol, data rate, and other specifications of NVM 220.

NVM interface 218 may manage NVM 220 based on memory management data, sometimes referred to herein as "metadata". The metadata may be generated by NVM driver 212 or may be generated by a module operating under the control of NVM driver 212. For example, metadata can include any information used for managing the mapping between logical and physical addresses, bad block management, wear leveling, ECC data (e.g., inner and outer ECC data) used for detecting or correcting data errors, or any combination thereof. The metadata may include data provided by file system 210 along with the user data, such as a logical address. Thus, in general, "metadata" may refer to any information about or relating to user data or used generally to manage the operation and memory locations of a non-volatile memory.

NVM interface 218 may be configured to store metadata in NVM 220. In some embodiments, NVM interface 218 may store metadata associated with user data at the same memory location (e.g., page) in which the user data is stored. For example, NVM interface 218 may store user data, the associated logical address, and ECC data for the user data at one or more memory locations of NVM 220. NVM interface 218 may also store other types of metadata about the user data in the same memory location.

NVM interface 218 may store the logical address so that, on power-up of NVM 220 or during operation of NVM 220, electronic device 200 can determine what data resides at that location. In particular, because file system 210 may reference the user data according to its logical address and not its physical address, NVM interface 218 may store the user data and logical address together to maintain their association. This way, even if a separate table maintaining the physical-to-logical mapping in NVM 220 becomes outdated, NVM interface 218 may still determine the proper mapping at power-up or reboot of electronic device 200, for example.

Figure 3:
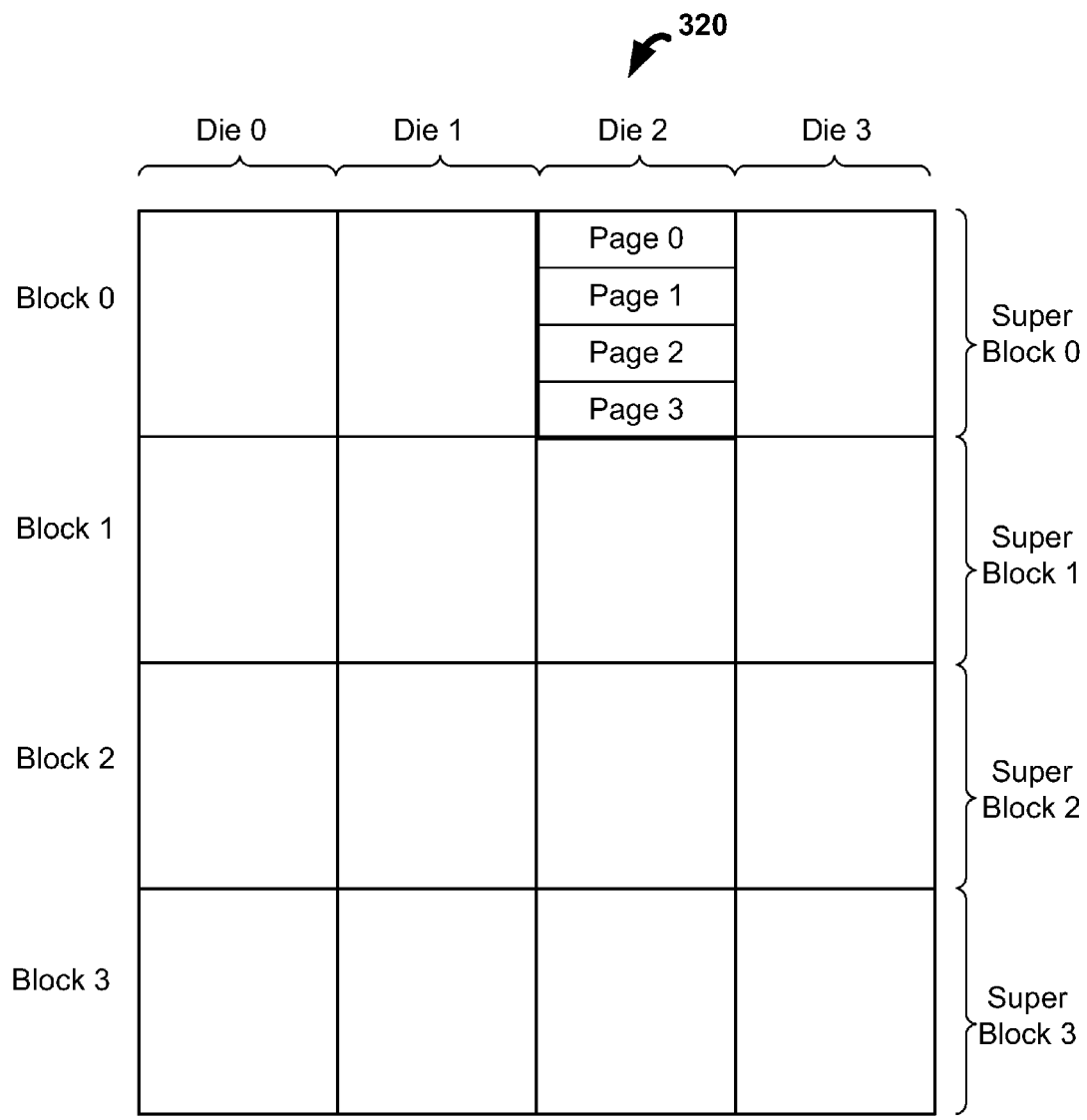
FIGS. 3-5 are functional views of non-volatile memories in accordance with various embodiments of the invention.
Figure 4:
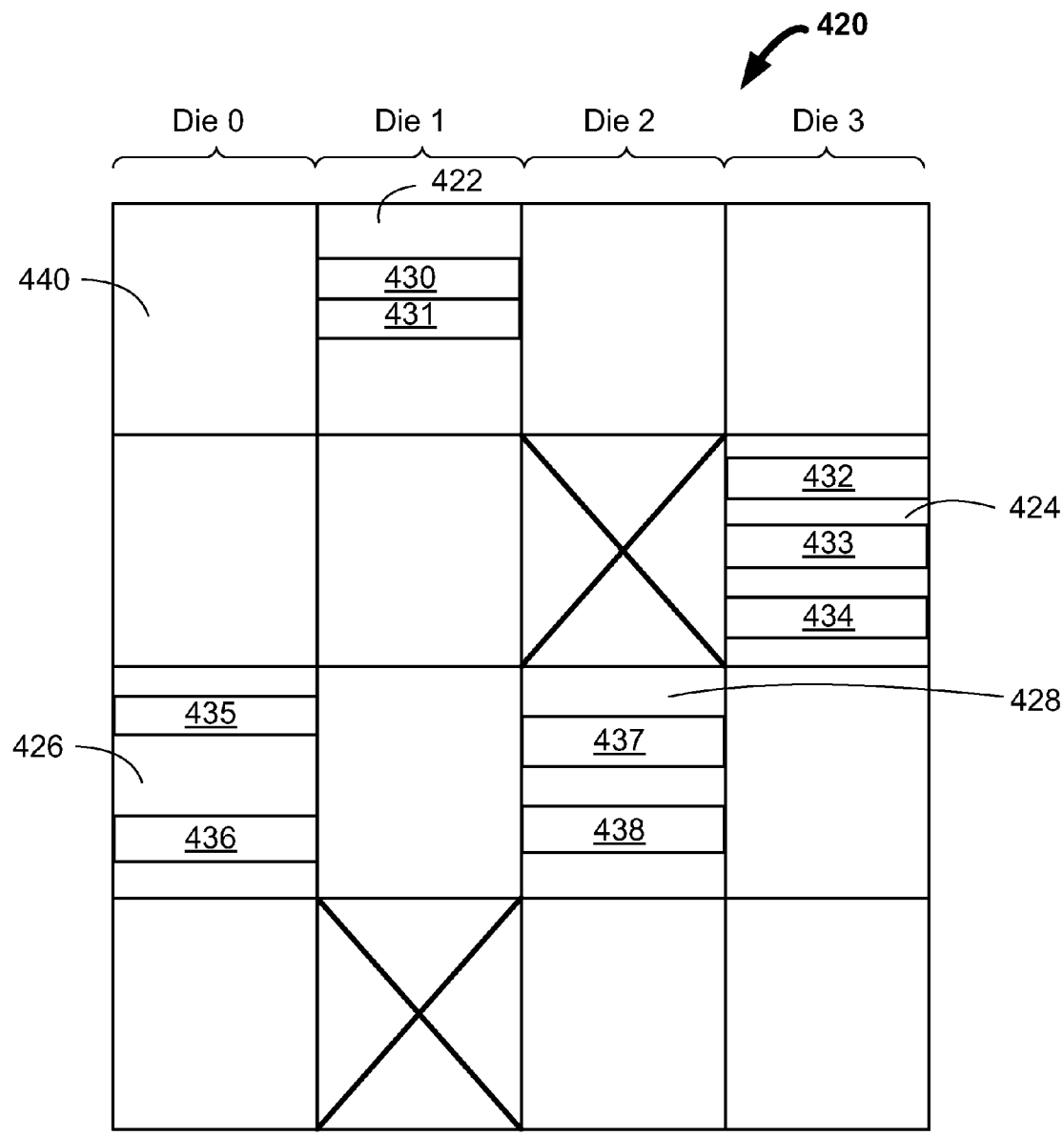
Figure 5:
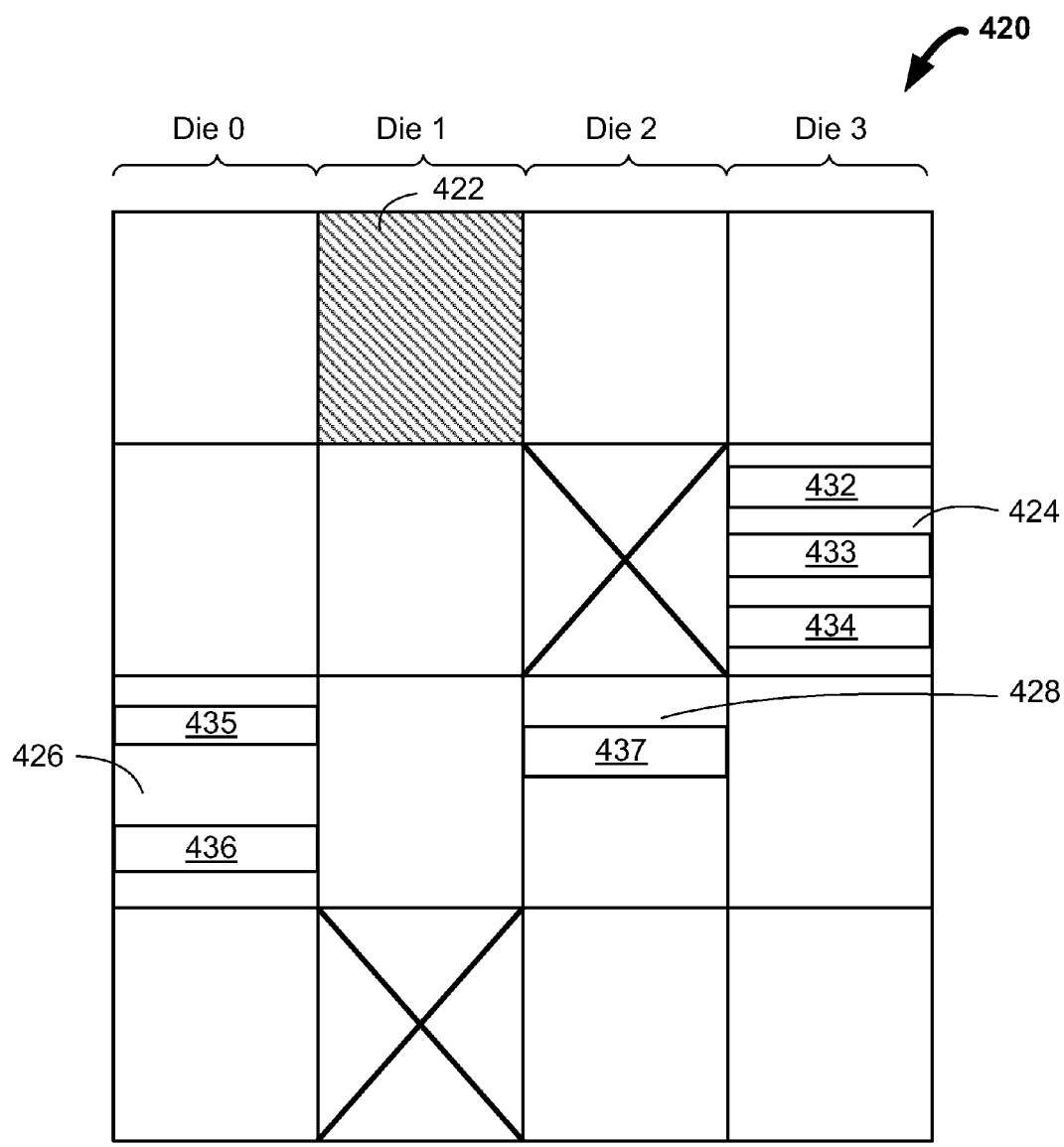

As mentioned above, a NVM (e.g., NVM 120 of FIG. 1 or NVM 220 of FIG. 2) can be organized into dies, blocks, pages, super blocks, and the like. For example, FIGS. 3-5 show schematic layouts of NVMs. FIGS. 3-5 are merely meant to illustrate the organizational layout of NVMs and do not indicate actual, physical layouts of the NVMs. For example, although die 0 is illustrated as being next to die 1 in FIGS. 3-5, this is merely for illustrating the functional relationship of these dies, and in the actual, physical layout of a NVM, these dies may or may not be located near one another. Moreover, although a certain number of dies, blocks, and pages are shown in FIGS. 3-5, this is merely for the purpose of illustration and one skilled in the art could appreciate that a NVM could include any suitable number of dies, blocks, and pages. As one illustration, each die of NVM 320 (FIG. 3) or NVM 420 (FIGS. 4 and 5) can include 4096 blocks, each block may include 64, 128, or 192 pages based on whether the block is an SLC block, 2-bit MLC block, or 3-bit MLC block, and each page can include 512 bytes.

Referring first to FIG. 3, NVM 320 can include one or more dies (i.e., integrated circuits), such as die 0, die 1, die 2, and die 3. Each die may then be organized into one or more "blocks". For example, dies 0-3 are illustrated as each being organized into blocks 0-3. During an erase command of NVM 320, an entire block of memory may be erased at once.

Each block of the dies may be organized into one or more pages. For example, block 0 of die 2 is illustrated as being organized into pages 0-3. During a read or write command of NVM 320, a full page may be read or written at once, respectively.

NVM 320 can also include one or more super blocks that include memory locations of a single block from one or more dies. Super blocks provide operational parallelism, thereby enabling programming, reading, and erase operations to be performed on memory locations located in different dies in parallel. Each super block may therefore belong to a particular bank or be a concurrently addressable unit ("CAU"). In some cases, a system can access a particular super block by changing the state of a chip enable ("CE") signal.

In some embodiments, a super block can include one block from each die that have the same position in the die or the same "block number". For example, as shown in FIG. 3, super block 0 of NVM 320 can include block 0 of each of dies 0-3. Similarly, super block 1 of NVM 320 can include block 1 of each of dies 0-3, super block 2 of NVM 320 can include block 2 of each of dies 0-3, and so forth.

In other embodiments, a super block can be formed by virtually linking or "striping" together a subset of memory locations. FIG. 4 shows a schematic layout of NVM 420. Similar to NVM 320 of FIG. 3, NVM 420 can include one or more dies (e.g., dies 0-3), and each die may be organized into one or more blocks.

In some embodiments, a super block can be formed by virtually linking or "striping" together a subset of memory locations of one block from one or more dies of NVM 420. The subset of memory locations need not be in the same page or word line of each die to be virtually linked as a super block. For example, as shown in FIG. 4, pages 430-438 from dies 0-3 may be virtually linked together to form a super block.

An NVM interface (e.g., NVM interface 118 of FIG. 1 or NVM interface 218 of FIG. 2) or a translation layer (e.g., translation layer 214 of FIG. 2) being implemented in the NVM interface may be used to keep track of memory locations associated with each super block. For example, the NVM interface or the translation layer can store the association between memory locations and super blocks as metadata on one or more pages of NVM 420. Consequently, some pages of NVM 420 can include user data, metadata, or both.

One or more blocks in NVM 420 can be marked as "bad blocks", which can correspond to those blocks in NVM 420 that cannot be used to reliably store data. Bad blocks can be determined using any suitable approach. For example, when NVM 420 is first integrated into a system, one or more tests can be performed on NVM 420. A NVM interface can then determine whether any blocks have failed those tests, and can mark those blocks as "factory bad blocks". Factory bad blocks can therefore be those blocks that do not function due to manufacturing defects. As such, these blocks are generally excluded from data storage. For example, in FIG. 4, blocks that are crossed out with an "X" may represent those blocks that have been marked as factory bad blocks.

As another example, one or more bad blocks may develop over time from previously good blocks as NVM 420 degrades due to the effects of a large number of cycles (e.g., program cycles, read cycles, and/or erase cycles). In addition, the size of these bad blocks may grow over time. Such bad blocks can be referred to as "grown bad blocks".

In some embodiments, after NVM 420 has been used for a period of time, a NVM interface may detect which blocks of NVM 420 have had at least one access failure (e.g., program, read, or erase failure), and may mark those blocks as grown bad blocks. In the example shown in FIG. 4, for instance, blocks 422-428 may represent those blocks that have been marked as grown bad blocks.

In a conventional system, when a bad block is detected, the system may retire the entire bad block, thus rejecting all of its associated memory locations. Unfortunately, such an approach can reduce the pool of programmable blocks in a NVM and can also lead to increased cycling of those blocks. Both of these factors can reduce the lifespan of the NVM.

Therefore, in order to prolong the lifespan of a NVM and reduce the cycling of blocks of the NVM, the system can instead form new dynamic super blocks from a subset of memory locations of one or more grown bad blocks of the NVM. That is, portions of blocks that would otherwise be completely retired can be recycled to form a dynamic super block. Such a system can reduce the rate at which the pool of programmable blocks is shrinking, thereby potentially turning an otherwise dead package into a functioning product.

In some embodiments, a NVM interface can select to form a new dynamic super block in response to one or more conditions. For example, the NVM interface may select to form a new dynamic super block when it detects that the number of grown bad blocks in one or more portions of the NVM has reached a pre-determined threshold (e.g., a minimum threshold). The NVM interface can monitor the number of grown bad blocks on any suitable portion(s) of the NVM such as, for example, on different CAUs, banks, CEs, any other suitable portion of the NVM, and/or any combination thereof.

Similar to the process described above, a dynamic super block can be formed by virtually linking or striping together a subset of memory locations of grown bad blocks from one or more dies of a NVM. Persons skilled in the art will appreciate that dynamic super blocks can be formed using a combination of factory bad blocks and grown bad blocks. However, because factory bad blocks may be considered less reliable than grown bad blocks, dynamic super blocks may be formed using only grown bad blocks.

In the example shown in FIG. 4, for instance, a NVM interface can determine that block 422 of die 1 is a grown bad block. After determining that block 422 is a grown bad block, the NVM interface can "scrub" block 422 to determine if any memory locations in block 422 can be recycled. The NVM interface can initiate the scrubbing process by selecting a subset of memory locations of block 422.

The NVM interface can select the subset of memory locations based on at least one reliability measurement of the subset of memory locations. For example, based on the results of one or more tests performed on the subset of memory locations, the NVM interface can calculate at least one reliability measurement for the subset of memory locations. In some cases, the tests can be run for one or more cycles depending on the type of access failure that was detected (e.g., more cycles can be performed for more serious access failures).

In some embodiments, the NVM interface may select a subset of word lines of a grown bad block as the subset of memory locations. For example, the NVM interface may have detected at least one access failure in a first subset of word lines of block 422. Responsive to this detection, the NVM interface can select a second subset of word lines of block 422, and can perform one or more tests on the second set of word lines. If the NVM interface determines that the second subset of word lines passes the one or more tests, the NVM interface can determine that the second subset of word lines is relatively reliable and select the second subset as the subset of memory locations.

In other embodiments, the NVM interface may select a subset of pages of a grown bad block as the subset of memory locations. For example, if block 422 is a MLC block that includes both lower and upper pages, the NVM interface can select a combination of the lower and/or upper pages of block 422 as the subset of memory locations. The lower and/or upper pages of block 422 can be selected based on any suitable characteristics of NVM 420 such as, for example, a vendor of NVM 420, a known fingerprint of NVM 420, the susceptibility to error of pages of NVM 420, any other suitable characteristic(s), and/or any combination thereof.

For example, the NVM interface can perform one or more tests on the lower and upper pages of block 422. By running the tests and determining which pages of block 422 pass the tests, the NVM interface can identify which lower and upper pages are less susceptible to error. The NVM interface can therefore select these lower and upper pages as the subset of memory locations. As another example, because lower pages of a MLC block generally have less leakage effects and create less data errors as compared to upper pages of the block, the NVM interface can select the lower pages of block 422 as the subset of memory locations.

In further embodiments, the NVM interface can exclude memory locations that have high raw bit error rates ("RBERs") or high uncorrectable bit error rates ("UBERs") from the subset of memory locations. For example, the NVM interface can determine a memory location of block 422 (e.g., a word line or page of block 422) that has a RBER (or UBER) that is below a pre-determined threshold. The NVM interface can then perform one or more tests on that memory location. If the memory location passes the one or more tests, the NVM interface can determine that there are no reliability issues with the memory location, and can therefore select the memory location as a portion of the subset of memory locations.

In some embodiments, although each of dies 0-3 of NVM 420 may include more than one grown bad block, the NVM interface can select memory locations from only one grown bad block of each die. For example, although block 440 of die 0 may also be marked as a grown bad block, the NVM interface may only be able to select memory locations from one of blocks 426 and 440 because both blocks are associated with die 0. In some embodiments, the NVM interface can determine which grown bad blocks to use based on a geometric relationship between the grown bad blocks and other grown bad blocks already selected for a dynamic super block.

In the example shown in FIG. 4, the NVM interface can select memory locations from grown bad block 426 of die 0, grown bad block 422 of die 1, grown bad block 428 of die 2, and grown bad block 424 of die 3. Consequently, the NVM interface can select a subset of memory locations from each grown bad block (e.g., pages 430 and 431 from grown bad block 422, pages 432-434 from grown bad block 424, pages 435 and 436 from grown bad block 426, and pages 437 and 438 from grown bad block 428).

After selecting the subset of memory locations, the NVM interface can strip together the subset of memory locations to form at least a portion of a dynamic super block. For example, for NVM 420, the NVM interface can combine pages 430-438 of grown bad blocks 422-428 to form a dynamic super block. Persons skilled in the art will appreciate that the subset of memory locations can be combined in any suitable manner to form the dynamic super block. For example, the subset of memory locations can be combined in a sequential order corresponding to the physical or logical addresses of the memory locations. The NVM interface or the translation layer can then store the association between the memory locations and the dynamic super block as metadata on one or more pages of NVM 420. In some embodiments, the dynamic super block can be aliased at the end of a super block space.

Once the dynamic super block has been formed, the NVM interface can use any suitable approach to communicate the existence of the super block to a translation layer (e.g., translation layer 214 of FIG. 2). For example, the NVM interface can set a flag indicating that a dynamic super block is available for programming. As another example, the NVM interface can issue a function call to the translation layer, which can indicate that a dynamic super block is available.

By generating a dynamic super block from one or more grown bad blocks of NVM 420, the dynamic super block can be used in a different mode than an original mode of the one or more grown bad blocks. For example, each of grown bad blocks 422-428 may have been configured as a MLC block, which provides higher storage density as compared to a SLC block. By striping together only a subset of memory locations of blocks 422-428 for the dynamic super block, the dynamic super block can instead be configured as a SLC block. Because SLC blocks are more reliable and have higher endurance than MLC blocks, the new dynamic super block can be more reliable than regular MLC super blocks.

The NVM interface can configure the dynamic super block as a SLC block using any suitable approach. In some embodiments, the NVM interface can direct a bus controller (e.g., NVM bus controller 216 of FIG. 2) to access the memory locations of the dynamic super block in a virtual SLC mode. For example, the NVM interface can direct the bus controller to access the lower pages of each of grown bad blocks 422-428 in a virtual SLC mode (e.g., a lower page only mode). As another example, the NVM interface can direct the bus controller to program data into the memory locations of the dynamic super block in a SLC mode.

In some embodiments, because a dynamic super block is generated from one or more grown bad blocks of NVM 420, the NVM interface may be selective about the types of data that can be stored in the dynamic super block. For example, the NVM interface may select to program only recoverable data in a dynamic super block such as, for example, user data, index page data (e.g., metadata mapping logical addresses to physical addresses), swap page files, translation layer metadata, any other suitable types of recoverable data, and/or any combination thereof. Because copies of recoverable data may be stored in multiple memory locations in NVM 420, the system can avoid data loss due to the failure of one or more of these memory locations in the dynamic super block. In some cases, the NVM interface can alias the recoverable data at the end of the dynamic super block (e.g., at memory locations with the highest physical addresses).

As another example, the NVM interface can store less important data in the dynamic super block. This way, even if the system experiences data loss due to the failure of one or more memory locations in the dynamic super block, system performance will not be significantly affected, and the user may not experience any inconvenience.

In other embodiments, an ECC module of the system (e.g., ECC module 116 of FIG. 1) may apply different types of error detection and/or correction to the dynamic super block. For example, the ECC module can apply ECC engines that have higher strengths to the data stored in the dynamic super block. As a result, more data errors (e.g., more bits of data) can be detected and corrected by the ECC module.

As another example, an ECC module can select to use a higher number of parity pages in the dynamic super block. By increasing the number of parity pages, the ECC module can generate additional sets of outer ECC data, thereby allowing more data errors to be detected and corrected. Thus, although the algorithm may slow system performance, the ECC module can ensure that greater data protection is provided. Moreover, in some embodiments, the ECC module can vary the amount of data protection depending on the type of data that is stored in the dynamic super block (e.g., whether the data is recoverable or important).

At a later point in time, one or more memory locations of the dynamic super block may fail. In some cases, in response to detecting one or more access failures in a portion of the dynamic super block, the NVM interface can retire at least a portion of the dynamic super block.

For example, FIG. 5 shows another schematic layout of NVM 420, where at least a portion of the dynamic super block has failed. For instance, referring now to both FIGS. 4 and 5, pages 430 and 431 of block 422 (FIG. 4) and page 438 of block 428 (FIG. 4) may have had one or more access failures.

In some embodiments, in response to detecting the one or more access failures, the NVM interface can retire the entire dynamic super block. For example, the NVM interface can retire all of pages 430-438 of the dynamic super block.

In other embodiments, in response to detecting one or more access failures in a portion of the dynamic super block, the NVM interface can retire only that portion of the dynamic super block. For example, upon detecting access failures in pages 430 and 431 of block 422, the NVM interface can retire pages 430 and 431. Furthermore, because block 422 no longer includes any other programmable memory locations, the entire block will also be retired. As a result, block 422 is shown as a shaded box in FIG. 5.

As another example, upon detecting access failures in page 438 of block 428, the NVM interface can retire page 438. However, because block 428 still has programmable page 437, not all pages of block 428 will be retired because the NVM interface can still include page 437 in the dynamic super block.

As a result of retiring one or more failed memory locations over time and gradually reducing the size of the dynamic super block, the NVM interface can continue to maintain a large pool of programmable blocks. This can reduce cycling of the available programmable blocks and prolong the lifespan of the NVM.

Eventually, a dynamic super block may need to be erased. For example, data stored on the dynamic super block can be copied to other memory locations before the data is erased from the dynamic super block. Subsequently, the NVM interface can reconstruct a new dynamic super block from the original dynamic super block. In some cases, this can also provide an opportunity for the NVM interface to progressively increase the size of the new dynamic super block.

For example, referring back to FIG. 4, an NVM interface may detect that a dynamic super block formed from pages 430-438 needs to be erased. Based on this detection, the NVM interface can prepare the dynamic super block for reprogramming (e.g., by copying the data stored on the dynamic super block to other memory locations, and then erasing the dynamic super block). The NVM interface can then reconstruct a new dynamic super block from the dynamic super block by progressively increasing the size of the new dynamic super block.

The NVM interface can reconstruct the new dynamic super block using any suitable approach. In some embodiments, in order to reconstruct the new dynamic super block, the NVM interface can determine first memory locations of the dynamic super block with reliability measurements (e.g., based on one or more test results) that exceed a first pre-determined threshold. The first pre-determined threshold can be set at a level such that the first memory locations can be considered to be the most reliable memory locations of the dynamic super block. After determining the first memory locations, the NVM interface can select the first memory locations as the new dynamic super block. In the example shown in FIG. 4, for instance, the NVM interface can determine that pages 432-437 have reliability measurements that exceed the first pre-determined threshold. Thus, pages 432-437 can form the new dynamic super block.

Then, at some later point in time, the NVM interface can determine if additional spare memory locations are needed. If the NVM determines that additional spare memory locations are needed, the NVM interface can determine second memory locations of the dynamic super block with reliability measurements that exceed a second pre-determined threshold. The second memory locations may be considered to be less reliable as compared to the first memory locations. Thus, in some cases, the second pre-determined threshold may be lower than the first pre-determined threshold. After determining the second memory locations, the NVM interface can add the second memory locations to the new dynamic super block, thereby progressively increasing the size of the new dynamic super block.

In the example shown in FIG. 4, for instance, the NVM interface can determine that pages 430, 431, and 438 have reliability measurements that exceed the second pre-determined threshold. The NVM interface can then add pages 430, 431, and 438 to pages 432-437 of the new dynamic super block. Persons skilled in the art will appreciate that this is merely an illustrative example, and that more than two thresholds can be used to progressively increase the size of the new dynamic super block.

In other embodiments, the NVM interface can reconstruct the new dynamic super block by selecting memory locations based on their physical positions in the NVM. For example, the NVM interface can initially select the lower pages of the dynamic super block to form a new dynamic super block. At a later point in time, if the NVM interface determines that additional spare memory locations are needed, the NVM interface can add the upper pages of the dynamic super block to the new dynamic super block. In further embodiments, the NVM interface can reconstruct the new dynamic super block by selecting memory locations based on a geometric relationship between the memory locations.

Figure 6:
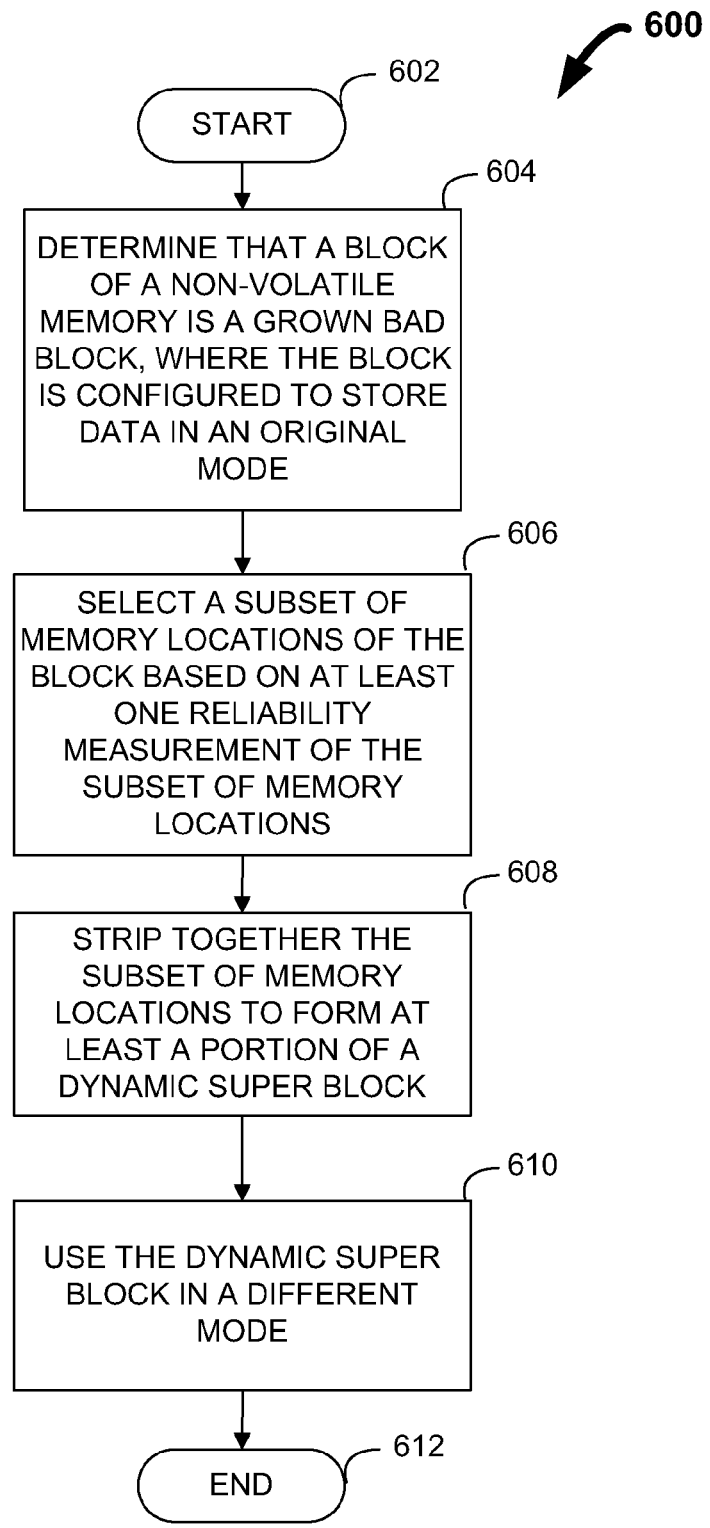
FIG. 6 is a flowchart of an illustrative process for generating a dynamic super block for a non-volatile memory in accordance with various embodiments of the invention.
Figure 7:
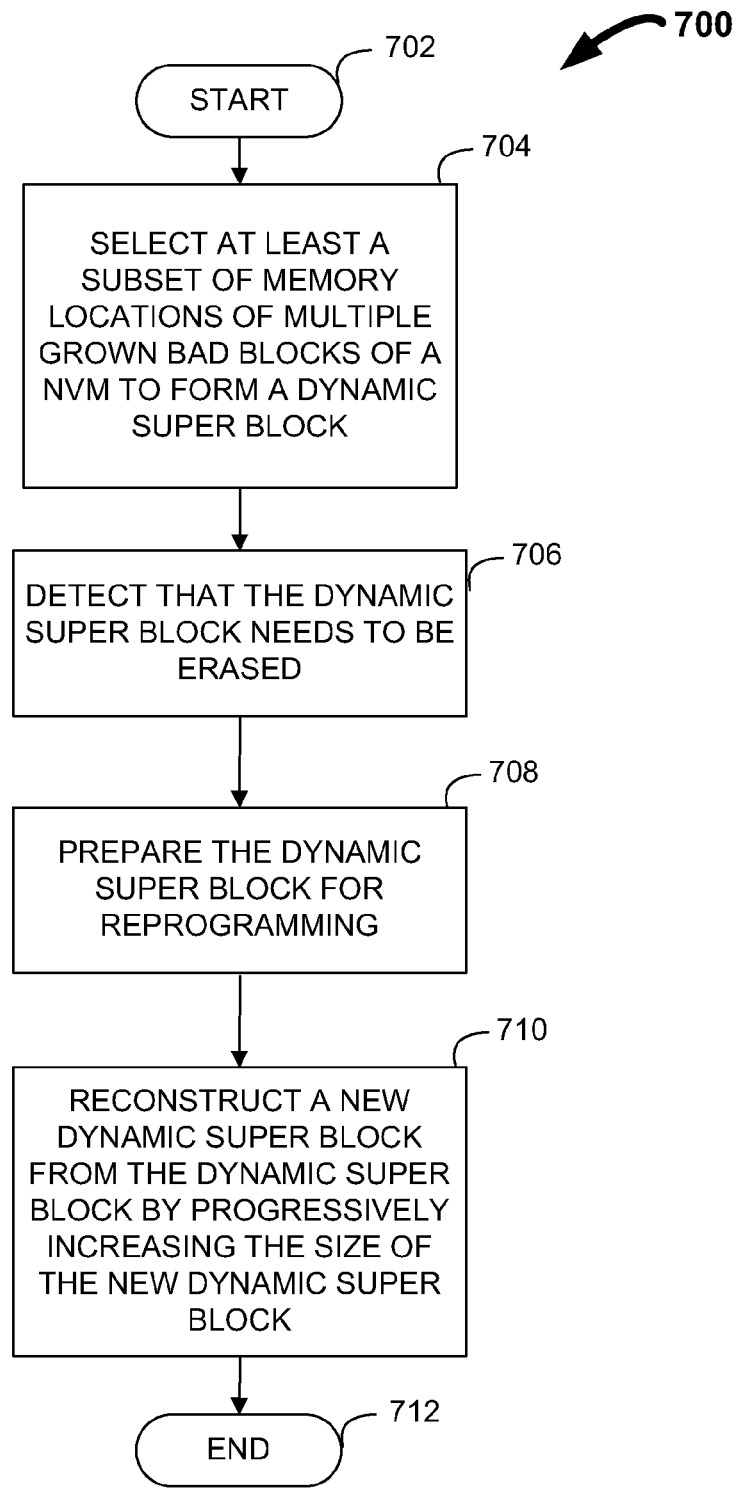
FIG. 7 is a flowchart of an illustrative process for reconstructing a new dynamic super block for a non-volatile memory in accordance with various embodiments of the invention.
Figure 8:
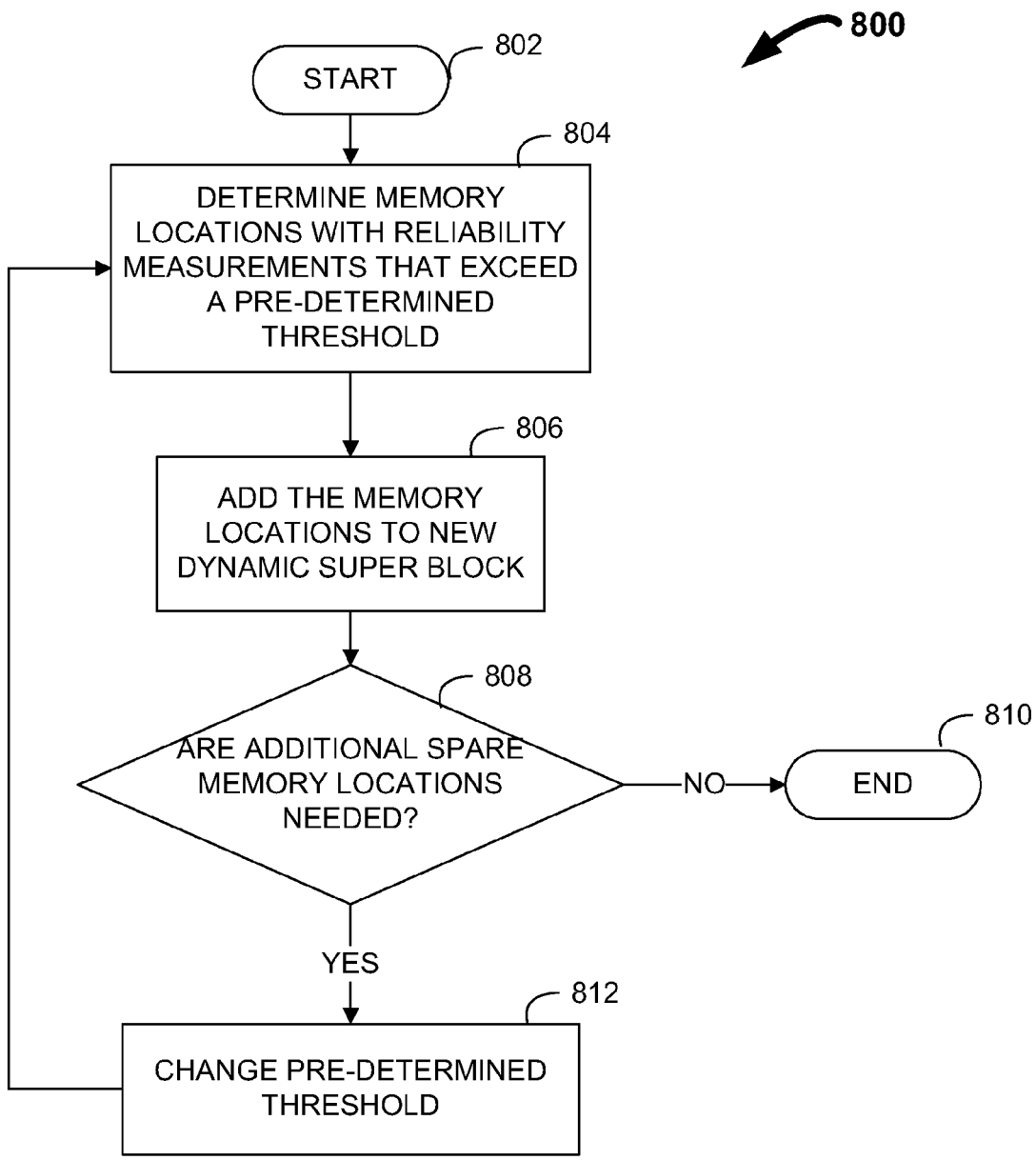
FIG. 8 is a flowchart of an illustrative process for progressively increasing the size of a new dynamic super block in accordance with various embodiments of the invention.

Referring now to FIGS. 6-8, flowcharts of illustrative processes are shown in accordance with various embodiments of the invention. These processes may be executed by one or more components in a system (e.g., electronic device 100 of FIG. 1 or electronic device 200 of FIG. 2). For example, at least some of the steps in the processes of FIGS. 6-8 may be performed by a NVM interface (e.g., NVM interface 118 of FIG. 1 or NVM interface 218 of FIG. 2).

Turning first to FIG. 6, process 600 is shown for generating a dynamic super block for a NVM (e.g., NVM 120 of FIG. 1 or NVM 220 of FIG. 2). Process 600 may begin at step 602. In some embodiments, a detection can be made that the number of grown bad blocks in one or more portions of the NVM has reached a pre-determined threshold (e.g., a minimum threshold).

At step 604, a determination can be made that a block of the non-volatile memory (e.g., one of blocks 422-428 of FIG. 4) is a grown bad block, where the block can be configured to store data in an original mode. For example, the block may be a MLC block with upper and lower pages. As another example, the block may be any block that is capable of storing data in a higher capacity mode.

At step 606, a subset of memory locations of the block may be selected based on at least one reliability measurement of the subset of memory locations. The subset of memory locations can include a subset of word lines of the block, a subset of pages of the block, any other suitable memory locations of the block, and/or any combination thereof.

In some embodiments, the reliability measurement can be calculated based on one or more tests performed on the subset of memory locations. For example, a NVM interface may determine that the block is a grown bad block by detecting at least one access failure in a first subset of word lines of the block. Responsive to this detection, the NVM interface can perform one or more tests on a second subset of word lines of the block. If the NVM interface determines that the second subset of word lines passes the tests, the second subset of word lines can be selected as the subset of memory locations.

In other embodiments, the NVM interface can select a combination of the lower and/or upper pages of the block as the subset of memory locations. The lower and/or upper pages of the block can be selected based on one or more characteristics of the NVM such as, for example, a vendor of the NVM, a known fingerprint of the NVM, the susceptibility to error of pages of the NVM, any other suitable characteristics, and/or any combination thereof. In further embodiments, memory locations that have high RBERs or high UBERs can be excluded from the subset of memory locations.

Continuing to step 608, the subset of memory locations can be striped together to form at least a portion of a dynamic super block. Then, at step 610, the dynamic super block can be used in a different mode. In some embodiments, the different mode can be a lower capacity mode. For example, the dynamic super block can be used as a SLC block (e.g., memory locations of the dynamic super block can be accessed in a virtual SLC mode, or data can be programmed into the memory locations of the dynamic super block in a SLC mode). In other embodiments, the different mode can be a lower page only mode. Process 600 may then end at step 612.

Referring now to FIG. 7, a flowchart of illustrative process 700 is shown for reconstructing a new dynamic super block for a non-volatile memory.

Process 700 may begin at step 702. At step 704, at least a subset of memory locations of multiple grown bad blocks of a NVM may be selected to form a dynamic super block. In some cases, each grown bad block that is selected can be on a different die of the NVM.

Then, at step 706, a detection can be made that the dynamic super block needs to be erased. For example, the dynamic super block may need to be erased when the super block has been fully invalidated. As another example, the dynamic super block may need to be erased when garbage collection needs to be performed on the super block. At step 708, the dynamic super block can be prepared for reprogramming. For example, data stored on the dynamic super block can be copied to other memory locations, and the dynamic super block can be erased.

Continuing to step 710, a new dynamic super block can be reconstructed from the dynamic super block by progressively increasing the size of the new dynamic super block. The reconstruction can be performed using any suitable approach such as, for example, based on one or more reliability measurements, the physical positions of the memory locations in the NVM, a geometric relationship between the memory locations, any other suitable factors, and/or any combination thereof. After reconstructing the new dynamic super block, process 700 may end at step 712.

Referring now to FIG. 8, a flowchart of illustrative process 800 is shown for progressively increasing the size of a new dynamic super block. In some embodiments, the new dynamic super block can be generated from a dynamic super block, which may have been formed using process 600 of FIG. 6, process 700 of FIG. 7, or using any other suitable approach. In some embodiments, process 800 may represent a more detailed view of reconstruction step 710 of process 700 (FIG. 7).

Process 800 may begin at step 802. At step 804, memory locations with reliability measurements that exceed a pre-determined threshold can be determined. For example, an NVM interface can determine first memory locations of a dynamic super block with reliability measurements (e.g., based on one or more test results) that exceed a pre-determined threshold. The pre-determined threshold can be set at a level such that the first memory locations can be considered the most reliable memory locations of the dynamic super block.

Continuing to step 806, the memory locations can be added to the new dynamic super block. Then, at step 808, a determination can be made if additional spare memory locations are needed. If additional spare memory locations are not needed, process 800 can end at step 810.

If additional spare memory locations are needed, process 800 can move to step 812. At step 812, the pre-determined threshold can be changed. For example, the pre-determined threshold can be changed to a second pre-determined threshold such that less reliable memory locations may be added to the new dynamic super block. Process 800 may then return to step 804.

At step 804, memory locations with reliability measurements that exceed the changed pre-determined threshold can be determined. For example, the NVM interface can determine second memory locations of the dynamic super block with reliability measurements that exceed the changed pre-determined threshold. After determining these memory locations, the memory locations can be added to the new dynamic super block at step 806.

It should be understood that processes 600, 700, and 800 of FIGS. 6-8, respectively, are merely illustrative. Any of the steps may be removed, modified, or combined, and any additional steps may be added, without departing from the scope of the invention.

The described embodiments of the invention are presented for the purpose of illustration and not of limitation.

What is claimed is:

1. A method for generating dynamic super blocks for a non-volatile memory, the non-volatile memory comprising a plurality of physical blocks and each physical block comprising a plurality of physical pages, the method comprising:

determining that at least one physical page of one of the physical blocks is not suitable for storing data in an original mode, but is suitable for storing data in a mode that has a lower capacity than the original mode, wherein the at least one determined page is mapped to a first block that requires its physical pages to store data in the original mode;

remapping the at least one determined page from the first block to a dynamic super block, wherein the dynamic super block is a block that requires its physical pages to store data in the mode that has a lower capacity than the original mode, and wherein a number of physical pages mapped to the dynamic super block increases as additional determined pages are remapped to the dynamic super block; and accessing the at least one physical page mapped to the dynamic super block in the mode that has a lower capacity than the original mode.

2. The method of claim 1, wherein the mode is a lower page only mode.

3. The method of claim 2, wherein the accessing the plurality of memory locations of the dynamic super block comprises accessing lower pages of each block of a plurality of blocks of the dynamic super block in a virtual single level cell ("SLC") mode.

4. The method of claim 1, wherein the determining comprises detecting at least one access failure in a first subset of word lines of the physical block.

5. The method of claim 4, wherein the selecting comprises further comprising:

selecting a second subset of word lines of the physical block;

performing at least one test on the second subset of word lines;

determining that the second subset of word lines passes the at least one test; and selecting the second subset of word lines as the subset of memory locations determined page.

6. The method of claim 1, wherein the determining comprises:

determining that a memory location of the block has a raw bit error rate that is below a pre-determined threshold;

performing at least one test on the memory location;

selecting the memory location as the at least on determined page if the memory location passes the at least one test.

7. The method of claim 1, wherein the accessing the plurality of memory locations of the dynamic super block comprises programming data into the plurality of memory locations in a SLC mode.

8. A memory interface for accessing a non-volatile memory, the non-volatile memory comprising a plurality of dies, each die comprising a plurality of physical blocks, the memory interface comprising:

a bus controller operative to communicate with the non-volatile memory; and control circuitry operative to:

determine that a block of a die of the plurality of dies is not suitable for storing data in a multi-level cell ("MLC") mode, wherein the determined block is mapped to a first block that requires its data to be stored in the MLC mode; and remap the determined block from the first block to a dynamic single level cell ("SLC") super block, wherein the dynamic SLC super block is a block that requires its data to be stored in a SLC mode that has a lower capacity than the MLC mode, and wherein a number of physical blocks mapped to the dynamic SLC super block increases as additional determined blocks are remapped to the dynamic SLC super block.

9. The memory interface of claim 8, wherein the control circuitry is operative to direct the bus controller to access memory locations of the dynamic SLC super block in a virtual SLC mode.

10. The memory interface of claim 9, wherein the data stored in the determined block is stored in lower pages of the block.

11. The memory interface of claim 8, wherein the control circuitry is operative to direct the bus controller to program data into memory locations of the dynamic SLC super block in a SLC mode.

12. The memory interface of claim 8, wherein the control circuitry is operative to:

detect at least one access failure in a portion of the dynamic SLC super block; and retire at least a portion of the dynamic SLC super block.

13. The memory interface of claim 12, wherein the control circuitry is operative to retire the dynamic SLC super block.

14. The memory interface of claim 12, wherein the control circuitry is operative to retire only the portion of the dynamic SLC super block that has the at least one access failure.

15. A method for managing grown bad blocks of a non-volatile memory, the method comprising:

selecting at least a subset of memory locations of multiple grown bad blocks of the non-volatile memory to form a dynamic super block;

detecting that the dynamic super block needs to be erased;

preparing the dynamic super block for reprogramming; and reconstructing a new dynamic super block from the dynamic super block by progressively increasing the size of the new dynamic super block.

16. The method of claim 15, wherein each grown bad block of the multiple grown bad blocks is on a different die of the non-volatile memory.

17. The method of claim 15, wherein the selecting further comprises programming only recoverable data in the dynamic super block.

18. The method of claim 17, wherein the recoverable data comprises at least one of user data, index page, swap page files, and translation layer metadata.

19. The method of claim 17, wherein the selecting further comprises aliasing the recoverable data at the end of the dynamic super block.

20. The method of claim 15, wherein the selecting further comprises applying error correction coding ("ECC") engines that have higher strengths to data stored in the dynamic super block.

21. The method of claim 15, wherein the selecting further comprises using a higher number of parity pages in the dynamic super block.

22. The method of claim 15, wherein the reconstructing further comprises:

determining first memory locations of the dynamic super block with reliability measurements that exceed a first pre-determined threshold; and selecting the first memory locations as the new dynamic super block.

23. The method of claim 22, further comprising:

determining that additional spare memory locations are needed;

determining second memory locations of the dynamic super block with reliability measurements that exceed a second pre-determined threshold, wherein the second pre-determined threshold is lower than the first pre-determined threshold; and adding the second memory locations to the new dynamic super block.

24. The method of claim 15, wherein the reconstructing further comprises selecting memory locations based on physical positions of the memory locations in the non-volatile memory.

25. The method of claim 24, wherein the memory locations are selected based on a geometric relationship between the memory locations.

* * * * *

UNITED STATES PATENT AND TRADEMARK OFFICE
CERTIFICATE OF CORRECTION

PATENT NO. : 8,832,507 B2
APPLICATION NO. : 12/861718
DATED : September 9, 2014
INVENTOR(S) : Daniel J. Post et al.

It is certified that error appears in the above-identified patent and that said Letters Patent is hereby corrected as shown below:

On Title Page, Column 1, in item (51), under "Int. Cl.", delete "*G11C 29/00*     (2006.01)
　　　　*G06F 12/02*     (2006.01)
　　　　*G06F 11/10*     (2006.01)
　　　　*H03M 13/09*     (2006.01)
　　　　*G11C 29/04*     (2006.01)
　　　　*H03M 13/15*     (2006.01)" and insert -- *G11C 29/00*     (2006.01) --, therefor.

Signed and Sealed this
Eighteenth Day of August, 2015

Michelle K. Lee
*Director of the United States Patent and Trademark Office*